United States Patent [19]

Yamada et al.

[11] Patent Number: 5,327,583
[45] Date of Patent: Jul. 5, 1994

[54] USING A CLOCK SIGNAL GENERATED BY A MICROCOMPUTER FOR PROVIDING A NEGATIVE BIAS VOLTAGE TO A GALIUM ARSENIDE FIELD EFFECT TRANSISTOR IN A HIGH FREQUENCY AMPLIFIER OF THE DEVICE

[75] Inventors: Shinji Yamada, Takasaki; Akira Masuda, Annaka, both of Japan

[73] Assignee: Hitachi, Ltd., Tokyo, Japan

[21] Appl. No.: 743,854

[22] Filed: Aug. 12, 1991

[30] Foreign Application Priority Data

Sep. 13, 1990 [JP] Japan .................................. 2-243119

[51] Int. Cl.$^5$ ............................................. H04B 1/16
[52] U.S. Cl. ...................................... 455/89; 455/126; 455/127; 307/296.5; 330/130; 330/137; 330/296

[58] Field of Search ............... 455/115, 117, 126, 127, 455/89; 330/130, 131, 135, 138, 137, 199, 253, 259, 261, 271, 279, 290, 296; 307/264, 296.3, 296.5

[56] References Cited

U.S. PATENT DOCUMENTS

| | | | |
|---|---|---|---|
| 5,032,740 | 7/1991 | Kannegundla | 307/264 |
| 5,050,235 | 9/1991 | Kojima | 455/127 |
| 5,095,542 | 3/1992 | Suematsu et al. | 455/127 |

FOREIGN PATENT DOCUMENTS 63-202106  8/1988  Japan .

Primary Examiner—Reinhard J. Eisenzopf
Assistant Examiner—Chi Pham
Attorney, Agent, or Firm—Fay, Sharpe, Beall, Fagan, Minnich & McKee

[57] ABSTRACT

In a mobile radio communication device, a gain of a GaAs FET for high frequency power amplification is controlled by a negative voltage based on a clock signal generated by a microcomputer in the device.

24 Claims, 3 Drawing Sheets

USING A CLOCK SIGNAL GENERATED BY A MICROCOMPUTER FOR PROVIDING A NEGATIVE BIAS VOLTAGE TO A GALIUM ARSENIDE FIELD EFFECT TRANSISTOR IN A HIGH FREQUENCY AMPLIFIER OF THE DEVICE

BACKGROUND OF THE INVENTION

The present invention relates to a technique useful in a mobile radio communication device and further to a super high-frequency band mobile radio communication device using a GaAs FET (gallium arsenide field effect transistor) in a high-frequency power amplifier, for example, in a digital mobile telephone or a cordless telephone.

FIG. 2 shows an outline constitution of a mobile radio communication device which was investigated by the present inventors prior to the present invention.

A mobile radio communication device shown in FIG. 2 is intended to be used especially for a mobile telephone whose main parts are composed of a signal source unit (base band unit) 1 generating sending signals to be signalled on the radio frequency, a sending unit (radio-frequency (RF) power module) 2 amplifying a sending signal from the signal source unit 1 to a predetermined sending power using GaAs FET 20, a receiving unit 3 carrying out the reception and demodulation of a radio signal, an antenna connecting unit 4 connecting output of the sending unit 2 and input of the receiving unit 3 to a common antenna unit 41 in the separated condition, an operation unit 5 gathering operating functions such as key switches and indicators, a power supply unit 6 supplying the positive operating source (+Vdd) being derived from the built battery to every part in the unit, a control unit 7 controlling centrally each unit (1–6) by integrated circuit universal logic control units, so-called micro computers (CPUs), a microphone 8 and a loudspeaker 9 carrying out sending and receiving speeches.

In the mobile radio communication device, (1) high level or multiple functioning has been made possible by the logic control of microcomputers. Also (2) the use of radio waves of super high frequency band such as 1.5 GHz band has been made possible by using a GaAs FET 20 for high-frequency power amplification in the sending unit 2. Further (3) the main functions, such as sending and control, are facilitated by single units thereby increasing the efficiency of the package and the degree of flexibility of the overall design.

By the above-mentioned items (1), (2) and (3), for example, a mobile telephone capable of being linked with a general public telephone line can be of a smaller type.

Here, in the above-mentioned device, when a radio signal is RF-power amplified using the GaAs FET 20, in the RF power amplifier, i.e., final amplifier 24, in addition to the positive operating supply voltage +Vdd, the negative bias voltage −VB is required so as to render the GaAs FET 20 inoperative. In order to obtain the negative bias voltage −VB, a communication device in the prior art has used an inverter power supply being composed of a combination of an independent oscillator and a rectifier. However, a problem is found in that when the inverter power supplies are built in the radio communication devices, the outputs of oscillators of those inverter power supplies become noise sources interfering with the normal operation of the radio communication devices.

Further, the inventors of the present invention have investigated that in the sending unit 2 for RF-power amplifying radio signals as shown in FIG. 2, a part of the radio signals outputted from a buffer amplifier 21 of the former stage is branched by a coupler 25, and the branched radio signals are rectified and smoothed by diodes and capacitors, thereby the negative bias voltage −VB is supplied to the final amplifier 24. That is to say, the negative voltage generator 26, with radio signals being made the input power supply, is built in the sending unit 2 (see JP-A-63-202106).

Thereby super high-frequency radio transmission can be carried out by a high-frequency power amplifier requiring a negative bias voltage −VB even if the negative voltage is not supplied from the outside.

However, the inventors of the present invention have revealed that the following problems exist in the above technique.

That is, (1) if radio signals are linear signals, the system in FIG. 2 is effective, as the energy of the radio signals can be deemed constant by taking the average thereof. But, if the radio signals are digital signals, the energy of the radio signals is not always constant on account of the modulation or the sending stop at the time of standby. For example, in the case of a digital mobile telephone, radio signals outputted from the base band unit 1 are made burst signals. Therefore, the energy of the signals in themselves varies according to whether sending signals exist or not. Therefore, stable and accurate negative bias voltage −VB cannot be obtained from the negative voltage generator 26 having radio signals being made burst signals as the input source. As a result, the case may occur in which stabilizing of the sending operation becomes difficult.

(2) Generally speaking, when an AC signal of the same power is obtained, the power consumption and the cost of the circuit necessary to get the AC signal tend to increase as the frequency of the AC signal becomes higher. Therefore, use of especially super high frequency radio signals such as 1.5 GHz in order to produce the DC negative bias voltage −VB would cause already limited power sources to be excessively consumed and circuit costs to be increased more than necessary.

(3) When super high frequency radio signals being not less than UHF or microwave bands are dealt with, the main circuits in the sending unit 2 are composed of a distributed constant such as slip lines. Therefore, the negative voltage generator 26 may be required to be installed with sufficient buffer spaces not to interfere with the distributed constant. As a result, necessary dimensions of the sending unit 2 are more significantly increased than required fundamentally by the negative voltage generator 26, and the efficiency of the package and the flexibility in external shape design may be significantly damaged.

(4) As the generation of the negative bias voltage −VB is carried out only inside the sending unit 2, when the negative bias voltage −VB is to be controlled centrally to the external control unit 7, for example, for switching the transmission power, the constitution would be complicated because of an increase in the wiring between units.

SUMMARY OF THE INVENTION

An object of the present invention is to provide a method of obtaining a stable negative power supply capable of maintaining the stability of a sending operation.

Another object of the present invention is to provide a mobile radio communication device having low power consumption.

A further object of the present invention is to provide a mobile radio communication device of low cost.

Still another object of the present invention is to provide a space saving mobile radio communication device.

Still further object of the present invention is to provide an RF power module suitable for a mobile radio communication device.

The foregoing and other objects and novel features of the present invention will become apparent from the description of the present specification and the attached drawings.

Explanation of the outlines of a representative embodiment of the invention disclosed in the present application is as follows.

The clock signal (for example, system clock) with a constant period being generated for the control in a control unit of a mobile radio communication device is used as input power supply, and DC voltage (negative voltage) having reverse polarity to this is generated. The DC voltage of the reverse polarity is supplied as bias voltage to a high frequency power amplifier in a sending unit.

According to the above-mentioned means, the following effects are obtained.

(1) Bias voltage with high stability and high accuracy is supplied to a high frequency power circuit, irrespective of the conditions of the radio signals. Thereby the sending operation can be securely stabilized. Also since an inverter using an independent oscillator becomes unnecessary by using clock signals generated for the control in the control unit, there is no occurrence of any new problem of noise to interfere with normal operation of the radio communication device.

(2) The energy of precious radio signals derived by using many power supplies and many expensive circuits is scarcely consumed for the object other than sending signals. Accordingly, the power consumption of supplies and the circuit cost can be reduced respectively.

(3) The voltage generator to obtain the bias voltage (negative voltage) of the reverse polarity can be installed, for example, in the control unit. In this case, the operation of the voltage generator and the system clock are not liable to interfere with a super high frequency circuit in the sending unit, and the voltage generator can be integrated with high density into the control unit. Accordingly, the efficiency of the package and the degree of flexibility of the external shape design are secured.

(4) Since the generation of the bias voltage (negative voltage) is carried out inside the control unit, the control of the bias voltage being carried out, for example, for switching the transmission power can be carried out centrally by the control unit without increasing the wiring between units or the like.

DESCRIPTION OF THE PREFERRED EMBODIMENTS

Preferred embodiments of the present invention will be described based on the accompanying drawings as follows.

Further, the identical symbol shows the identical or corresponding part in every figure.

Figure 1:
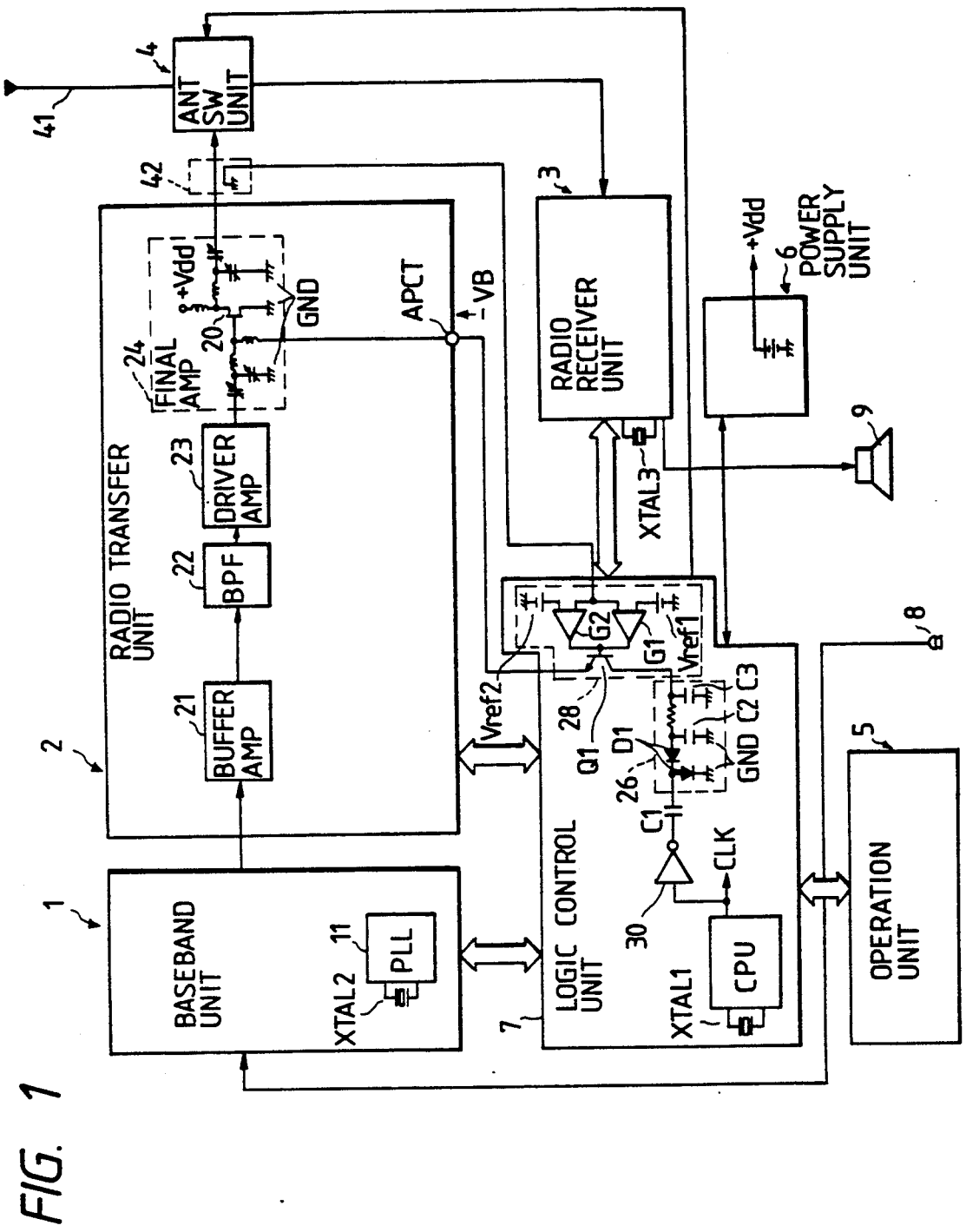
FIG. 1 is a block diagram showing outline constitution of a radio communication device by an embodiment of the present invention.
Figure 2:
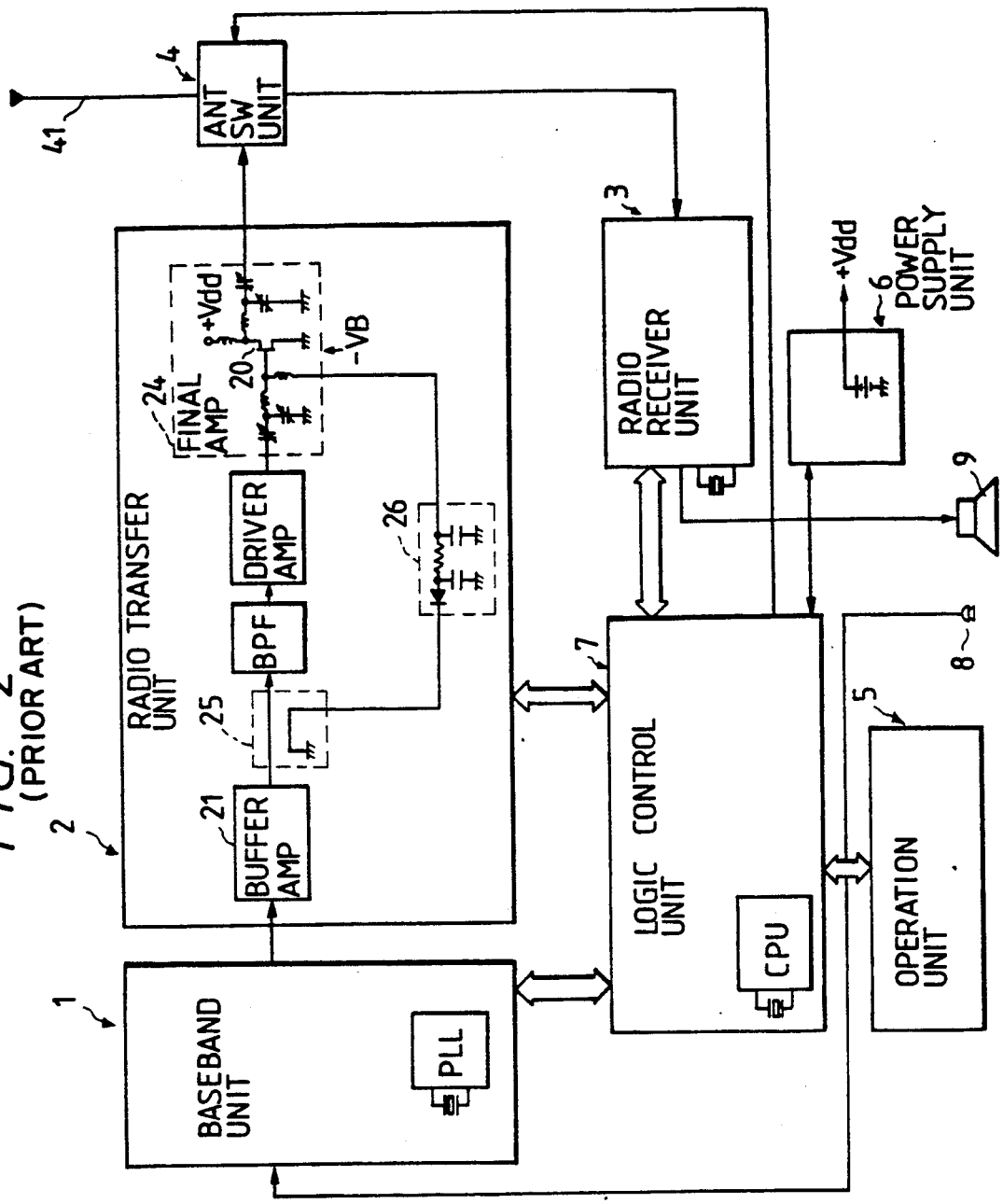
FIG. 2 is a block diagram showing outline constitution of a radio communication device investigated prior to the present invention.

FIG. 1 shows an embodiment of a mobile radio communication device to which the technique of the present invention is applied.

The device shown in FIG. 1 is constituted as a mobile telephone which performs radio communication in two directions (2WAY) by ultra high frequency wave of UHF band or microwave band. The device comprises a signal source unit (baseband unit) 1 for generating radio signals being composed of FM (frequency module signal) or SSB (single side band signal) or the like, a radio transfer unit (transfer power module) 2 for performing high frequency power amplification of the radio signals from the signal source unit 1 using GaAs FET 20 into predetermined transfer power, a radio receiver unit 3 for performing reception and demodulation of radio signals, an antenna switching unit 4 for connecting output of the transfer unit 2 and input of the receiver unit 3 to a common antenna 41 under the condition of mutual separation by a directional coupler, a so-called duplexer, an operation unit 5 collecting operating functions such as a keyswitch and a display, a power supply unit 6 for providing the positive operating power supply voltage (+Vdd) derived from built-in batteries such as Ni-Cd batteries or Li batteries to each part in the device, a logic control unit 7 for controlling each unit (1-6) in the device by an integrated general-purpose logic control unit, a so-called microcomputer (CPU), a microphone 8 for sending a speech, and a loudspeaker 9 for receiving a speech. Further, GND shows the earth potential (0V).

The microcomputer (CPU) is coupled to a crystal oscillator (XTAL1), and generates clock signals CLK steadily at the time of operation.

Figure 3:
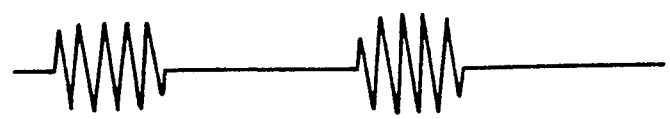
FIG. 3 is a waveform chart of digital output of the base band unit in FIG. 1.

Here, the signal source unit 1 has a PLL (phase locked loop) 11 operating based on output frequency of a crystal oscillator (XTAL2) and a modulation circuit (not shown), and generates radio signals modulated by an audio signal from the microphone 8. For example, when the mobile radio communication device is a digital system, the modulated radio signal is a burst signal as shown in FIG. 3.

The transfer unit 2 is composed of a buffer amplifier 21, a band pass filter (BPF) 22, a driver amplifier 23, a final part 24 and the like, and amplifies the radio signal from the signal source unit 1 to predetermined transmission power. The amplified radio signal is inputted to the antenna 41 through the antenna connection unit 4. A high frequency power amplifier of the final part 24 uses the GaAs FET 20 as its output element in order to perform power amplification in super high frequency range of UHF band or microwave band. The GaAs FET 20 can amplify the transmission power with high efficiency. However, since the GaAs FET 20 is depression type which is turned on even if the gate voltage is zero, in order to turn it off, the gate voltage must be made negative voltage. That is, when the gain adjustment or the output adjustment of the final part 24 is carried out to make the transmission power a suitable value, the negative voltage must be applied to the gate of the GaAs FET 20.

The reception unit 3 receives radio signals sent on a frequency other than the sending frequency, and demodulates the received signals into a control signal and a speaking signal respectively. The control signal is sent as control information to the control unit 7, and the speaking signal is applied as a sound driving input to the loudspeaker 9.

The control unit 7 is provided therein with a negative voltage generator 26 for supplying the negative bias voltage $-VB$ to the GaAs FET 20 of the final part 24 of the transfer unit 2. The voltage generator 26 is composed of an input capacitor C1, a rectifier diode D1, and smoothing capacitors C2, C3. The voltage generator 26 is supplied with clock signal (system clock) CLK of a constant period generated steadily by the microcomputer (CPU) for the control through a CMOS inverter 30, and uses the clock signal CLK as the input power supply and generates the negative bias voltage $-VB$ by half wave rectification. Since the clock signal CLK is supplied through the CMOS inverter 30 to the voltage generator 26 in this manner, a signal for negative voltage can be obtained without adversely affecting the microcomputer (CPU).

The clock signal CLK has, for example, frequency 10 MHz and duty 50%, and has the signal amplitude of 5 V, and the microcomputer (CPU) has been made always operating for identifying received signals or for system control at the time of the standby for reception, the reception and the sending. Therefore, the clock signal CLK is continuously outputted from the microcomputer (CPU). The negative bias voltage $-VB$ is supplied to the final part 24 through a negative bias voltage terminal APCT provided in the transfer unit 2. Since the negative voltage generator 26 provided in the control unit 7 has the clock signal as input power supply, which is supplied steadily and has the period, the duty ratio and the amplitude being constant, the negative bias voltage $-VB$ being very stable and highly accurate can be generated. Further, although an example producing the negative voltage by half wave rectification has been indicated in the above description, a full wave rectification system is permissible as the rectification system. That is, rectification systems are chosen to obtain the negative voltage having necessary values.

The control unit 7 further comprises a control circuit 28 for controlling whether or not the stable negative voltage $-VB$ generated by the negative voltage generator 26 is applied to the gate electrode of the GaAs FET 20. The control circuit 28 includes a bipolar transistor Q1 having a collector-emitter path coupled, for example, between output node of the negative voltage generator 26 and a negative bias voltage terminal APCT, and control circuits G1, G2 for sending control signals base of the transistor Q1. The control circuits G1, G2 have the first input coupled with the output signal line of the transfer unit 2 through the coupler 42. The control circuit G1 has further the second input supplied with reference voltage Vref1. On the other hand, the control circuit G2 has the second input supplied with reference voltage Vref2 (Vref2<Vref1). When the output voltage of the transfer unit 2 becomes a predetermined value or more, the first input potential of the circuit G1 becomes not less than the reference voltage Vref1 for example, and the control circuit G1 outputs a signal having such a level as making the transistor Q1 the ON condition. In response to the ON condition of the transistor Q1, the negative voltage $-VB$ generated by the negative voltage generator 26 is supplied to the gate of the GaAs FET 20 of the transfer unit 2 through the terminal APCT. Therefore, the gain of the GaAs FET 20 is reduced and the value of the transmission power is decreased. On the other hand, if the value of the transmission power is made not more than the predetermined value, as the voltage of the first input of the control circuit G2 is reduced to the value not more than Vref2, the control circuit G2 generates a signal having such a level as making the transistor Q1 the OFF condition. As a result, the gain of the GaAS FET 20 is made high and the value of the transmission power is made high.

Figure 4:
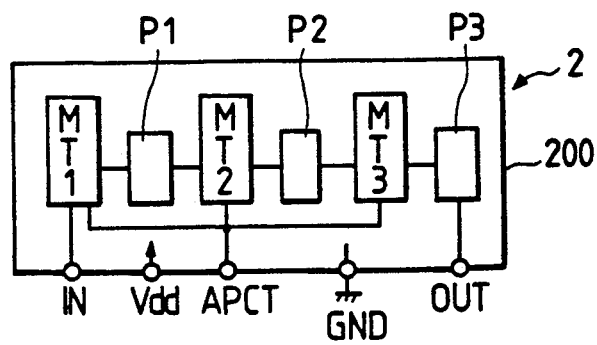
FIG. 4 is a plan view of the RF sending unit (RF power module) in FIG. 1.

FIG. 4 shows a plan view when the transfer unit 2 of FIG. 1 is realized on a ceramic substrate 200.

The ceramic substrate 200 has, for example, an input terminal IN receiving output signals of the base band unit 1, a power supply voltage terminal Vdd, a negative bias voltage terminal APCT receiving the negative voltage $-VB$, an earth voltage terminal GND and an output terminal OUT supplying output signals to the antenna connecting unit 4 as external terminals.

The buffer amplifier 21, the band pass filter 22, the driver amplifier 23 and the final part 24 in FIG. 1 are constituted by matching circuits MT1-MT3 and power transistors P1-P3 here. The matching circuits MT1-MT3 are for taking input or output impedance matching, and are formed by coupling of a distributed constant circuit and a chip-type capacitor on the ceramic substrate. The power transistors P1 to P3 are all composed of GaAs FETs. However, they are not limited to this, but the power transistors P1 and P2 may be made MOSFETs to be easily controlled, and the power transistor P3 may be GaAs FETs with high efficiency. In this case, as $APC_{MOS}$ (auto power control) voltage to adjust the gain of the power transistors P1 and P2 composed of enhancement type MOSFET and $APC_{GaAs}$ voltage to adjust the gain of the power transistor P3 composed depression type GaAs FET are made different, that is, as the $APC_{MOS}$ voltage is made the positive potential and the $APC_{GaAs}$ voltage is made the negative potential, the APCT terminal in the figure is made two terminals, $APCT_{MOS}$ terminal and $APCT_{GaAs}$ terminal. Moreover, it can be easily comprehended that the $APCT_{MOS}$ terminal is supplied from a control circuit having similar constitution to the control circuit 28 with the power supply voltage $+Vdd$ outputted from the power supply unit in FIG. 1.

Figure 5:
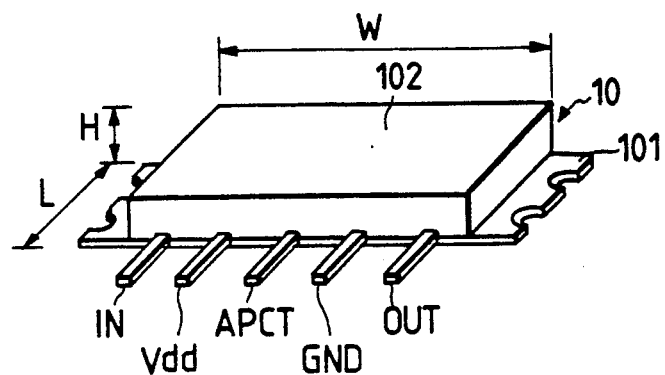
FIG. 5 is a perspective view of module of the RF sending unit in FIG. 4.

FIG. 5 shows a perspective view of an RF power module 10 containing a transfer unit 2 being formed on the ceramic substrate 200 in FIG. 4. For the module 10, there is no limitation. in its constitution. It has a stem 101 made of aluminum (A1), an aluminum cap 102, five lead terminals (IN, Vdd, APCT, GND, OUT) and a ceramic substrate 200 on which a transfer unit 2 in FIG. 4 is formed. These five lead terminals (IN, Vdd, APCT, GND, OUT) are electrically connected to the terminals (IN, Vdd, APCT, GND, OUT) respectively on the ceramic substrate 200 in FIG. 4 through aluminum wires. The module 10 is minimized such as 15 mm in length (L), 30 mm in width (W), 7 mm in height (H), and is suitable for miniaturization of a mobile radio communication device. Further when the APCT terminal is separated into the $APCT_{MOS}$ terminal and the $APCT_{GaAs}$ terminal, the lead terminal APCT in FIG. 5 is made two lead terminals.

Figure 6:
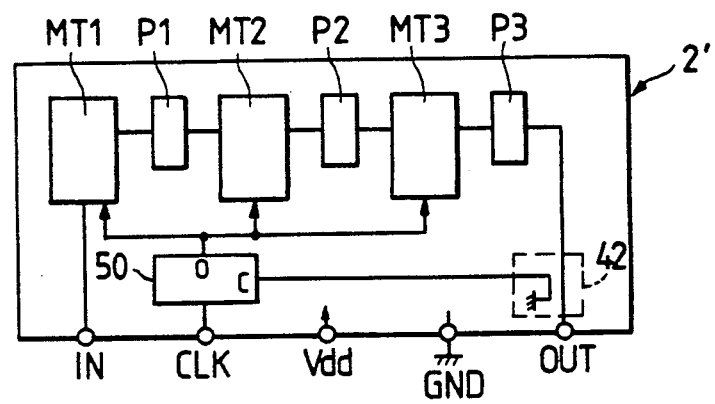
FIG. 6 is a plan view of an RF sending unit according to another embodiment.

FIG. 6 shows another embodiment of a transfer unit 2 shown in FIG. 4. Only a part different from FIG. 4 will be described as follows.

A transfer unit 2' in FIG. 6 comprises a control circuit 50 including a CMOS inverter (buffer) 30, a capacitor C1, a negative voltage generator 26 and a control circuit 28 installed within the control unit 7 in FIG. 1, and a coupler 42. Therefore, the transfer unit 2' has an external terminal CLK receiving a clock signal CLK. Moreover, when the transfer unit 2' in FIG. 6 is assembled as RF power modules in FIG. 5, the APCT terminal of FIG. 5 is made a clock terminal CLK.

Figure 7:
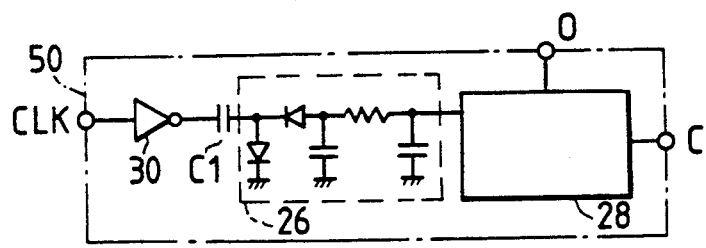
FIG. 7 is a circuit diagram showing constitution of the control circuit 50 in FIG. 6.

FIG. 7 shows the constitution of the control circuit 50 in FIG. 6, and the description shall be omitted here as it is obvious from the above description.

There is a method for varying the voltage of a collector among the methods for the gain control of a bipolar transistor when it is used as a power transistor. In this case, it is difficult for the efficiency and the optimum condition of output to be compatible, because the matching condition varies depending on the collector voltage, as is the case also in GaAs FET. Further, changing the collector (or drain) potential is equivalent to changing the supply voltage, and there exists a difficulty in controlling a large power and a problem of generation of loss and the consequent reduction of efficiency.

When GaAs FETs are utilized as power transistors, the gains can be changed by changing the potential of their gates. Since the gate of GaAs FET has a high impedance at the direct current and the drain potential need not be changed, the matching state is not damaged and further the gain control by little energy is possible.

In the case of MOSFET, a negative power supply is not necessary if it is an enhancement type, but it is necessary to apply a negative voltage to the gate in order to cut off GaAs FET, as the GaAs FET is a depression type.

Conventional apparatuses rarely have another negative power supply. GaAs FETS having high efficiency and superior frequency characteristics compared with the bipolar transistor or MOSFET of silicon, are not being extensively used in the market because of their inconvenience of necessitating negative power supplies for their use.

An example using RF-signal to produce negative power supplies has been disclosed in JP-A-3-202106, but in the cellular type which is expected to become the main current (a digital mobile radio communication device), the negative voltage for GaAs FET is intended to be generated using a clock signal which is a stabler signal source, as the RF signal is a burst signal.

Since the clock signal CLK is normally CMOS output, the signal amplitude is not less than 3 V and the desired negative voltage can be obtained by rectifying. The gate impedance of GaAs FET being high, the power required by the negative power (−VB) supply may be low, and a clock signal CLK may be rectified after being received at one stage of the CMOS buffer 30 or the like.

The effects obtained by the present invention will be described as follows.

(1) Because of the generation of negative voltage by a certain period of a clock signal CLK as an input power supply, the GaAs FET 20 of the high frequency power is supplied with negative bias voltage −VB of high stability and high precision without any influence of the variation whenever the energy of radio frequency signal varies owing to the modulation or transfer stop at the standby. Therefore, transfer operations can be securely stabilized. Further, there is no concern that the problem of noises interfering with the normal operation of radio communication devices takes place, because inverter power supplies having independent oscillators become unnecessary by using clock signals CLK generated for control in the control unit 7.

(2) Clock signals CLK for control are supplied easily using a relatively inexpensive non-linear circuit consuming little power, because the clock signals CLK are two-state logic signals of H (high level) or L (low level). On the other hand, since radio signals are in higher frequency range and have many linear elements, supply of the radio signals is liable to be accompanied by relatively large power loss and requires expensive high-frequency circuits. Therefore, consumed power and circuit cost necessary to obtain the negative bias voltage −VB can be reduced respectively by using clock signals CLK as input source of the negative voltage generator 26. Radio frequency signals need not be consumed for the purpose other than transfer.

(3) The negative voltage generator 26 to obtain the negative bias voltage −VB is installed within the control unit 7 separate from the transfer unit 2, thereby it is not liable to interfere with the super high-frequency circuit in the transfer unit 2, and can be built in the control unit 7 with high density together with the microcomputer or the like. Accordingly, the efficiency of the package and the freedom of design of the external form are secured.

(4) Since the generation of the bias voltage −VB takes place in the control unit 7, for example, when the bias voltage −VB is controlled for switching of the transmission power, the control can be performed centrally at the control unit 7 without increasing the wirings between units.

In the mobile radio communication devices adopting logic control circuits using high-frequency power amplifiers and microcomputers requiring the negative bias voltage −VB, improvement is realized with respect to stability of transfer operations, low power consumption, low cost and space savings.

Although the invention carried out by the present inventor has been explained concretely based on embodiments, the present invention is not limited to the above embodiments but many variations may be made without departing from the spirit and scope thereof.

For example, the voltage value of the negative bias voltage −VB generated by the negative voltage generator 26 can be elevated arbitrarily to the necessary value by using the voltage doubler rectifying circuit. The circuit carrying out high frequency power amplification by using the negative bias voltage −VB may be constituted by using output elements other than GaAs. Moreover, the negative bias voltage −VB may be supplied to a unit other than the radio frequency transfer unit when it is required there.

Although the invention carried out by the present inventor has been explained mainly regarding the case of using in mobile telephones constituting the field of utilization which forms the background of the invention, the present invention is not limited to this but can be applied, for example, to a radio frequency repeater such as a repeater or a transponder. At the very least, it can be applied to a radio communication device carrying out the logic control using a microcomputer or the like.

The effects obtained by the representative among the inventions disclosed in the present application will be briefly described as follows.

That is, in a mobile radio communication device adopting a logic control circuit being constituted by a high-frequency power amplifier and a microcomputer requiring bias voltage of reverse polarity, stability of transfer operation, low power consumption, low cost and space savings can be improved.

What is claimed is:

1. A mobile radio communication device comprising:
   a signal source unit for generating first radio signals;
   a transfer unit having a power amplifier for amplifying said first radio signals to produce amplified signals having a predetermined transmission power and for supplying said amplified signals to an antenna;
   a reception unit for performing reception and demodulation of second radio signals from said antenna;
   a control unit having a central processing unit which synchronously performs operations in accordance with clock signals having a predetermined frequency, said control unit being electrically coupled to said signal source unit, said transfer unit and said reception unit for controlling said signal source unit, said transfer unit and said reception unit;
   a power supply unit for generating a power supply voltage of a positive level and for supplying said power supply voltage to at least one of said signal source unit, said transfer unit, said reception unit, and said control unit, and
   a bias voltage generator which generates a bias voltage of a negative level from said clock signals and which supplies said bias voltage to said power amplifier.

2. A mobile radio communication device according to claim 1, wherein said power amplifier includes a GaAs FET having a gate coupled to receive said bias voltage, activation and deactivation of said GaAs FET being controlled in accordance with said bias voltage.

3. A mobile radio communication device according to claim 2 further comprising:
   a control circuit for supplying said bias voltage to said gate of said GaAs FET when a level of said predetermined transmission power of said amplified signals is higher than a predetermined level and for stopping supplying said bias voltage to said gate of said GaAs FET when said level of said predetermined transmission power of said amplified signals is lower than said predetermined level.

4. A mobile radio communication device according to claim 2, further including:
   a microphone electrically coupled to said signal source unit, wherein said signal source unit includes a modulation circuit for generating said first radio signals by modulating an audio signal from said microphone, and
   wherein said transfer unit further includes:
   a buffer amplifier coupled to receive said first radio signals;
   a band pass filter electrically coupled to said buffer amplifier; and
   a driver amplifier electrically coupled between said band pass filter and said gate of said GaAs FET.

5. A mobile radio communication device according to claim 1, wherein said transfer unit is formed on a substrate, wherein said substrate is included in a module, and wherein said module includes a cap for covering said substrate.

6. A mobile radio communication device according to claim 5, wherein said module includes said bias voltage generator.

7. A mobile radio communication device according to claim 5, wherein said module does not include said bias voltage generator.

8. A mobile radio communication device according to claim 1, wherein said bias voltage generator includes:
   an input terminal coupled to receive said clock signals,
   an output terminal electrically coupled to said power amplifier,
   a first node,
   a second node,
   a first condenser coupled between said input terminal and said first node,
   a second condenser coupled between said second node and an earth potential,
   a third condenser coupled between said output terminal and said earth potential,
   a first diode having its anode coupled to said first node and its cathode coupled to said earth potential;
   a second diode having its anode coupled to said second node and its cathode coupled to said first node; and
   a register coupled between said second node and said output terminal.

9. A mobile radio communication device according to claim 1, further including:
   a switch circuit for selectively coupling said transfer unit and said reception unit to said antenna, said switch circuit being controlled by said control unit.

10. A mobile radio communication device including a microcomputer supplying system clock signals having a predetermined frequency and a high-frequency power amplifier having a GaAs FET, said device comprising:
    negative voltage generating means for receiving said system clock signals and forming a negative voltage; and
    a control circuit for selectively supplying said negative voltage supplied from said negative voltage generating means to a gate of said GaAs FET, activation and deactivation operations of said GaAs FET being controlled in accordance with said negative voltage,
    wherein said control circuit is electrically coupled between said negative voltage generating means and said gate of said GaAs FET.

11. A mobile radio communication device according to claim 10, further comprising a power supply unit for supplying a positive power supply voltage to said microcomputer,
  wherein said microcomputer receives said power supply voltage and uses said positive power supply voltage for performing its operations.

12. A mobile radio communication device according to claim 10, wherein said control circuit supplies said negative voltage to said gate of said GaAs FET when a level of a transmission power of output signals from said high-frequency power amplifier is higher than a predetermined level, and stops supplying said negative voltage to said gate of said GaAs FET when said level of said transmission power is lower than said predetermined level.

13. A mobile radio communication device according to claim 10, wherein said high-frequency power amplifier is formed on a substrate,
  wherein said substrate is included in a module, and
  wherein said module includes a cap for covering said substrate.

14. A mobile radio communication device according to claim 13, wherein said module includes said negative voltage generating means.

15. A mobile radio communication device according to claim 13, wherein said module does not include said negative voltage generating means.

16. A mobile radio communication device according to claim 10, wherein said negative voltage generating means includes:
  an input terminal coupled to receive said system clock signals,
  an output terminal electrically coupled to said gate of said GaAs FET,
  a first node,
  a second node,
  a first condenser coupled between said input terminal and said first node,
  a second condenser coupled between said second node and an earth potential,
  a third condenser coupled between said output terminal and said earth potential,
  a first diode having its anode coupled to said first node and its cathode coupled to said earth potential;
  a second diode having its anode coupled to said second node and its cathode coupled to said first node; and
  a register coupled between said second node and said output terminal.

17. An RF power module comprising:
  a first terminal for receiving a power supply voltage
  a second terminal for receiving an earth potential;
  an input terminal for receiving an input signal;
  an output terminal;
  a clock input terminal for receiving clock signals having predetermined frequency;
  a GaAs FET having a drain coupled to said output terminal and to said first terminal electrically, a source coupled to said second terminal, and a gate coupled to receive a signal based on said input signal; and
  a negative voltage generator electrically coupled between said clock input terminal and said gate of said GaAs FET for rectifying said clock signals on the clock input terminal and forming a negative voltage being not more than said earth potential.

18. An RF power module according to claim 17, wherein said clock input terminal is coupled to an external microcomputer, said external microcomputer including means for executing operations in accordance with said clock signals.

19. An RF power module according to claim 18, wherein said RF power module includes a substrate and a cap for covering said substrate.

20. An RF power module according to claim 17, wherein said negative voltage generator includes:
  a third terminal electrically coupled to said clock input terminal in order to receive said clock signals,
  a fourth terminal electrically coupled to said gate of said GaAs FET,
  a first node,
  a second node,
  a first condenser coupled between said third terminal and said first node,
  a second condenser coupled between said second node and said second terminal,
  a third condenser coupled between said fourth terminal and said second terminal,
  a first diode having its anode coupled to said first node and its cathode coupled to said second terminal;
  a second diode having its anode coupled to said second node and its cathode coupled to said first node; and
  a register coupled between said second node and said fourth terminal.

21. A mobile telephone comprising:
  an antenna;
  a signal source unit for generating first radio signals;
  a transfer unit having a power amplifier for amplifying said first radio signals to produce amplified signals having a predetermined transmission power and for supplying said amplified signals to said antenna;
  a reception unit for receiving and modulating second radio signals from said antenna;
  a switch circuit;
  a control unit having a microprocessor which synchronously performs operations in accordance with first clock signals having a predetermined frequency, said microprocessor including means for outputting second clock signals in accordance with said first clock signals, said control unit being electrically coupled to said signal source unit, said transfer unit, said reception unit and said switch circuit for controlling said signal source unit, said transfer unit, said reception unit and said switch circuit; and
  a voltage generator which generates a bias voltage of a negative level in accordance with said second clock signals and which supplies said bias voltage to said power amplifier,
  wherein said switch circuit is controlled by said control unit so that said transfer unit and said reception unit are selectively coupled to said antenna.

22. A mobile telephone according to claim 21, wherein said transfer unit is formed on a substrate on which a cap is provided,
  and wherein said voltage generator is formed on said substrate.

23. A mobile telephone according to claim 21, wherein said transfer unit is formed on a substrate on which a cap is provided,
  wherein said voltage generator is not formed on said substrate.

24. A mobile telephone according to claim 21, wherein said power amplifier includes a GaAs FET having its gate coupled to selectively receive said biased voltage.

* * * * *

UNITED STATES PATENT AND TRADEMARK OFFICE
CERTIFICATE OF CORRECTION

PATENT NO. : 5,327,583
DATED : July 5, 1994
INVENTOR(S) : Shinji Yamada, et al.

It is certified that error appears in the above-indentified patent and that said Letters Patent is hereby corrected as shown below:

On title page, item [54] and col. 1, lines 1-5, should read as follows;

MOBILE COMMUNICATION DEVICE USING A CLOCK SIGNAL GENERATED BY A MICROCOMPUTER FOR PROVIDING A NEGATIVE BIAS VOLTAGE TO A GALIUM ARSENIDE FIELD EFFECT TRANSISTOR IN A HIGH FREQUENCY AMPLIFIER OF THE DEVICE

Signed and Sealed this

Sixth Day of September, 1994

Attest:

BRUCE LEHMAN

*Attesting Officer*  *Commissioner of Patents and Trademarks*